United States Patent
Chen et al.

(10) Patent No.: US 9,085,733 B2
(45) Date of Patent: Jul. 21, 2015

(54) YTTRIUM ALUMINUM GARNET PHOSPHOR, METHOD FOR PREPARING THE SAME, AND LIGHT-EMITTING DIODE CONTAINING THE SAME

(71) Applicant: National Cheng Kung University, Tainan (TW)

(72) Inventors: In-Gann Chen, Tainan (TW); Yung-Tang Nien, Tainan (TW); Heueh-Jung Lu, Tainan (TW); Chia-Wei Ma, Tainan (TW)

(73) Assignee: National Cheng Kung University, Tainan (TW)

( * ) Notice: Subject to any disclaimer, the term of this patent is extended or adjusted under 35 U.S.C. 154(b) by 189 days.

(21) Appl. No.: 13/707,766

(22) Filed: Dec. 7, 2012

(65) Prior Publication Data
US 2013/0146918 A1     Jun. 13, 2013

(30) Foreign Application Priority Data
Dec. 8, 2011   (TW) .............................. 100145405 A

(51) Int. Cl.
*H01L 33/50*   (2010.01)
*C09K 11/77*   (2006.01)
*H01L 33/44*   (2010.01)

(52) U.S. Cl.
CPC ............ *C09K 11/7774* (2013.01); *H01L 33/44* (2013.01); *H01L 33/502* (2013.01)

(58) Field of Classification Search
CPC ........... C09K 11/7774; C09K 11/0838; H01L 33/502
See application file for complete search history.

(56) References Cited

U.S. PATENT DOCUMENTS
2001/0048966 A1 * 12/2001 Trumble et al. ................. 427/66

FOREIGN PATENT DOCUMENTS
CN          102173774 A     9/2011

OTHER PUBLICATIONS

Xu Sheng-Yan, Zhang Xiao-Song, Zhou Yong-Liang, Xi Qun and Li Lan, Influence of Si4+ substitution on the temperature-dependent characteristics of Y3Al5O12:Ce, Chin. Phys. B vol. 20, No. 3 (2011) 037804.
Zong-Heng Lu, Diffusion and Luminescence Property of Si and Ce Doped Y3AL5O12 Phospors, Master Thesis, 2009, National Cheng Kung University, Taiwan.

* cited by examiner

*Primary Examiner* — Matthew W Such
*Assistant Examiner* — Scott Stowe
(74) *Attorney, Agent, or Firm* — Bacon & Thomas, PLLC

(57) ABSTRACT

The present invention relates to yttrium aluminum garnet phosphor, a method of preparing the same and a light-emitting diode containing the same. The yttrium aluminum garnet phosphor of the present invention is represented by the following formula (I):

$$(Y_{3-a}M_a)Al_{5-b}Si_bO_{12} \quad\quad (I)$$

wherein, $0.01 \leq a \leq 0.2$, $0 < b \leq 1.2$, and M is at least one selected from the group consisting of Ce, Dy, Gd, Eu, Tb, La, Pr, Nd, and Sm.

13 Claims, 2 Drawing Sheets

YTTRIUM ALUMINUM GARNET PHOSPHOR, METHOD FOR PREPARING THE SAME, AND LIGHT-EMITTING DIODE CONTAINING THE SAME

CROSS REFERENCE TO RELATED APPLICATION

This application claims priority from Taiwan Patent Application Serial Number 100145405, filed on Dec. 8, 2011, the subject matter of which is incorporated herein by reference.

BACKGROUND OF THE INVENTION

1. Field of the Invention

The present invention relates to an yttrium aluminum garnet phosphor material, a method of preparing the same and a light-emitting diode device containing the same, more particularly, to a silicon-doped yttrium aluminum garnet phosphor material, a method of preparing the same and a light-emitting diode device containing the same.

2. Description of Related Art

Owing to energy shortage, climate warming and the rise in eco-awareness, green technologies have become one of the main development aims in the technology related to energy conservation. In particular, many advanced countries in the world have been actively involved in the development of white LEDs to replace traditional lighting equipments in recent years.

Compared to traditional incandescent lamps and fluorescent lamps, LEDs have the advantages of compact volume, low heat radiation, low power consumption, long lifetime, rapid response and environmentally friendliness, and can be flat-packaged for the development of light, thin and small products. Therefore, LEDs can be considered as a potential for new light sources for $21^{th}$ century in the lighting file due to their properties of electricity saving and environmental protection.

In a traditional LED package, phosphor powder is mixed with a polymer resin or epoxy and then coated on a LED chip. As shown in FIG. 1, a conventional LED device includes an LED chip 101 and an encapsulating material 102 that includes phosphor powder 103 dispersed therein and covers the light output surface of the LED chip 101.

However, such package structure often suffers from poor thermal dissipation and is particularly unsuitable for high performance LED devices that require high thermal performance. Besides, the yellowing of the polymer resin used for the encapsulating material 102 may occur under long-term high temperature circumstance, and thus adversely affects luminous efficiency of LEDs and greatly shortens the lifetime of LEDs.

Therefore, it is desirable to develop a novel phosphor material that can exhibit high photoelectric conversion efficiency and can be applied in LED package structures other than the existing LED package to mitigate the problems induced by the yellowing of the encapsulating material.

SUMMARY OF THE INVENTION

It is one object of the present invention to provide an yttrium aluminum garnet (YAG) phosphor material with high density and high luminance intensity.

It is another object of the present invention to provide a method of manufacturing an yttrium aluminum garnet (YAG) phosphor material, such that a YAG phosphor material with high density and high luminance intensity can be prepared at a relatively lower temperature.

It is yet another object of the present invention to provide a light-emitting diode (LED) device, which can exhibit prolonged lifetime due to discarding of the traditional resin packaging technology.

To achieve the object, the present invention provides a YAG phosphor material represented by the following formula (I),

$$(Y_{3-a}M_a)Al_{5-b}Si_bO_{12} \tag{I}$$

where, $0.01 \leq a \leq 0.2$, $0 < b \leq 1.2$, and M is at least one selected from the group consisting of Ce, Dy, Gd, Eu, Tb, La, Pr, Nd and Sm.

Besides, the present invention further provides a method of manufacturing the above-mentioned YAG phosphor material, including: (A) providing a precursor powder that includes yttrium, aluminum and a metal, where the metal is at least one selected from the group consisting of Ce, Dy, Gd, Eu, Tb, La, Pr, Nd and Sm; (B) pre-sintering the precursor powder to obtain a phosphor precursor; (C) adding a silicon precursor in the phosphor precursor; and (D) sintering a mixture of the silicon precursor and the phosphor precursor to obtain the YAG phosphor material.

Also, the present invention provides a light-emitting diode device containing the above-mentioned YAG phosphor material, including: an LED chip; and a YAG phosphor ceramic plate that is disposed on a light output surface of the LED chip and is made of a material as mentioned above.

Compared to YAG phosphor material doped with no silicon, the YAG phosphor material of the present invention can exhibit enhanced luminance intensity due to a small amount of silicon contained therein. In addition, in the method of manufacturing the YAG phosphor material according to the present invention, a small amount of silicon precursor can induce an easier diffusion of the metal dopant (i.e. M) in the YAG phosphor material and thus enhance the luminance intensity. Moreover, a liquid phase sintering occurring with the presence of the silicon precursor can effectively enhance the density of the YAG phosphor material. As the increased densification of the YAG phosphor material causes the reduction of pores in the phosphor, the thermal conductivity can be enhanced owing to fewer amounts of poor thermal conductor (i.e. air) contained in the YAG phosphor material. Accordingly, the light-emitting device containing the YAG phosphor material manufactured by the present invention can exhibit high thermal conductivity and prolonged lifetime.

In the method for manufacturing the YAG phosphor material according to the present invention, the silicon precursor in the step (C) can be added in an amount from 0.1 wt % to 10 wt % based on the total weight of the YAG phosphor material. It is preferable to add the silicon precursor in an amount from 3 wt % to 8 wt % based on the total weight of the YAG phosphor material. It is more preferable to add the silicon precursor in an amount from 4 wt % to 6 wt % based on the total weight of the YAG phosphor material. It is most preferable to add the silicon precursor in an amount of 5 wt % based on the total weight of the YAG phosphor material. The increase of the silicon precursor amount can result in enhancement of the YAG crystallinity and decrease of the impurity phase amount. When increasing the amount of the silicon precursor up to 5 wt %, almost only YAG phase exists and the optimum luminous efficiency can be achieved. However, if the silicon precursor is added in an excess amount larger than 10 wt %, the crystallinity of the YAG phosphor material would decrease and unknown impurity phases would appear, resulting in the reduction of the luminous efficiency.

Accordingly, in the YAG phosphor material and the LED containing the same in accordance with the present invention, b in the formula (I) of the YAG phosphor material preferably is in a range of $0.06 \leq b \leq 0.6$, more preferably $0.2 \leq b \leq 0.6$, and most preferably is 0.3.

Moreover, the method of manufacturing the YAG phosphor material according to the present invention can further include a step (A1) after the step (A): adding a silicon precursor. Preferably, the total amount of the silicon precursor added in the steps (A1) and (C) is not larger than 10 wt % to prevent the reduction of the luminous efficiency.

Besides, in the method of manufacturing the YAG phosphor material according to the present invention, the metal included in the precursor powder preferably is at least one selected from the group consisting of Ce, Tb and Eu, and more preferably is Ce. Therefore, in the YAG phosphor material and the LED containing the same in accordance with the present invention, M of the formula (I) preferably is at least one selected from the group consisting of Ce, Tb and Eu, and more preferably is Ce. Various phosphor materials that emit different colors of light can be prepared by doping of various metals (i.e. M). For example, yellow phosphor powder can be prepared by doping YAG with Ce (i.e. YAG:$Ce^{3+}$); green phosphor powder can be prepared by doping YAG with Tb (i.e. YAG:$Tb^{3+}$); and red phosphor powder can be prepared by doping YAG with Eu (i.e. YAG:$Eu^{3+}$). Blue light can excite YAG:$Ce^{3+}$ and be mixed with yellow light emitted from YAG:$Ce^{3+}$ to generate white light.

In the method of manufacturing the YAG phosphor material according to the present invention, the phosphor precursor can be prepared by any known method in the art for manufacturing a YAG phosphor material. For example, chemical co-precipitation method, solid state reaction method, sol-gel method, spray pyrolysis method, spray drying method (please refer to U.S. Pat. No. 6,712,993), combustion method, hydrothermal synthesis, sintering method, microwave-assisted combustion method, or solid state aluminum synthesis method may be executed. In addition to the above-mentioned methods, those methods mentioned in TW 1262212, TW 1265916 and TW 200942597 also can be adopted. Preferably, the preparation of the phosphor precursor includes a chemical co-precipitation method or a solid state reaction method. In consideration of the advantages of the solid state reaction method (e.g. simple process and low-cost starting materials), it is preferable to prepare the phosphor precursor by a solid state reaction method in the step (B).

Specifically, an aluminum precursor, an yttrium precursor and a metal precursor can be provided and mixed in the step (A) of the method of manufacturing the YAG phosphor material according to the present invention, followed by the above-mentioned method to form the phosphor precursor. Specific examples of the aluminum precursor may be aluminum nitrate or its hydrate or alumina. The yttrium precursor may be yttrium nitrate or its hydrate or yttria. According to requirements, the metal precursor may be a metal nitrate (or its hydrate) or a metal oxide, and the metal can be at least one selected from the group consisting of Ce, Dy, Gd, Eu, Tb, La, Pr, Nd and Sm.

In the method of manufacturing the YAG phosphor material according to the present invention, the silicon precursor is not particularly limited as long as a eutectic reaction between the silicon precursor and YAG can occur. For example, the silicon precursor may be an organic silicon, inorganic silicon or a mixture thereof. Specific examples of the silicon precursor include silica ($SiO_2$), tetramethyl orthosilicate ($C_4H_{12}O_4Si$), tetraethyl orthosilicate ($C_8H_{20}O_4Si$), tetrapropyl orthosilicate ($C_{12}H_{28}O_4Si$), tetraisopropyl orthosilicate ($C_{12}H_{28}O_4Si$), tetrabutyl orthosilicate ($C_{16}H_{36}O_4Si$), tetra-o-cresol orthosilicate ($C_{28}H_{28}O_4Si$), tetra(2-Ethyl Butyl)silicate ($C_{24}H_{52}O_4Si$), silicon tetrachloride ($SiCl_4$), metasilicate ($H_2SiO_3$), disilicate ($H_2Si_2O_5$), silicic acid ($H_4SiO_4$), silanol ($H_4OSi$), tetramethylsilane ($C_4H_{12}Si$) and hexamethyldisiloxane ($C_6H_{18}OSi_2$). Preferably, the silicon precursor is silica.

Furthermore, the method of manufacturing the YAG phosphor material according to the present invention can further include a step (C1) after the step (C): pressing the mixture of the silicon precursor and the phosphor precursor. Specifically, the mixture of the silicon precursor and the phosphor precursor can be shaped into a green body by uniaxial pressing or cold isostatic pressing in the step (C1), followed by the sintering process in the subsequent step (D). Accordingly, the resulting YAG phosphor material can be a YAG phosphor ceramic plate. In the case of applying the YAG phosphor ceramic plate of the present invention in an LED device, the YAG phosphor ceramic plate can be fixed on a light output surface of an LED chip through an adhesive so as to obtain an LED device of the present invention which discards the traditional packaging technology. Therefore, in the LED device using the YAG phosphor ceramic plate, less polymer resin is required, and the color temperature of yellow light emitted from the YAG phosphor ceramic plate can be measured before packaging so as to reduce manufacturing cost and enhance product yield.

Additionally, in the step (B) of the method of manufacturing the YAG phosphor material according to the present invention, the precursor powder can be pre-sintered for 10-30 hours (preferably 12-24 hours) at a temperature from 900° C. to 1800° C. (preferably 1200° C. to 1500° C.), followed by cooling to room temperature to get the phosphor precursor containing YAG phase. Alternatively, when the preparation of the phosphor precursor includes the chemical co-precipitation method, the precursor powder can be pre-sintered in the step (B) for 1-5 hours at a temperature from 300° C. to 800° C., followed by cooling to room temperature to get the phosphor precursor.

Moreover, in the step (C) of the method of manufacturing the YAG phosphor material according to the present invention, after adding the silicon precursor in the phosphor precursor, a dry or wet-ball milling process can be performed to diminish the particle size of the mixture of the silicon precursor and the phosphor precursor by dry or wet-ball milling with grinding balls (such as alumina grinding balls). Besides, the mixture of the silicon precursor and the phosphor precursor can be sintered for 10-30 hours (preferably 12-24 hours) at a temperature from 900° C. to 1800° C. (preferably 1200° C. to 1500° C.) in the step (D) to get the YAG phosphor material. If necessary, the sintering process in the step (D) can be repeated multiple times.

In the LED device of the present invention, the LED chip may be a UV LED chip or a blue LED chip. Preferably, the LED chip is a blue LED chip.

DETAILED DESCRIPTION OF THE PREFERRED EMBODIMENT

Figure 1:
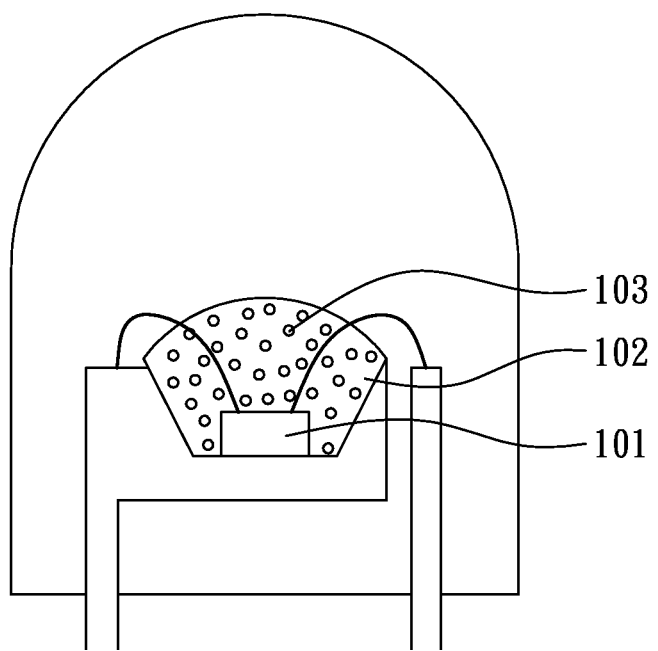
FIG. 1 shows a schematic view of a conventional LED device.

Hereafter, examples will be provided to illustrate the embodiments of the present invention. Other advantages and effects of the invention will become more apparent from the disclosure of the present invention. Other various aspects also may be practiced or applied in the invention, and various modifications and variations can be made without departing from the spirit of the invention based on various concepts and applications.

Examples 1-5 and Comparative Example 1

Preparation of YAG Phosphor Material by Chemical Co-Precipitation Method

First, 23.4457 g of aluminum nitrate hydrate, 14.3820 g of yttrium nitrate hydrate and 0.0543 g of cerium nitrate hydrate were mixed in a stoichiometric ratio of $Y_{2.99}Ce_{0.01}Al_5O_{12}$ and completely dissolved in 125 mL of distilled water.

Next, 42.5 mL of triethylamine were gradually titrated therein with stirring for several minutes to generate white gel, followed by suction filtering to get the white gel. Subsequently, the gel was dried for 20 hours in an oven at 90° C. to remove moisture and then pre-sintered for 3 hours at 500° C. (heating rate: 5° C./min) to burn organic components, followed by cooling to room temperature (cooling rate: 5° C./min) to get a desired precursor.

According to the weight ratios shown below in Table 1, $SiO_2$ powder as a silicon precursor was added in the precursor, followed by a ball milling process for 5 hours using alumina balls with a diameter of 5 mm in a ball/powder weight ratio of 3 g/2.5 g to get finer powders.

The above mixed powders were pressed into a green body with a diameter of 2.56 cm by uniaxial pressing or cold isostatic pressing under a pressure of 25-35 kg/cm² for 10 minutes. The resulting green body was heated to 1400° C. at a heating rate of 5° C./min and maintained at a constant temperature for 8 hours, followed by natural cooling to room temperature to get a YAG phosphor ceramic plate.

Examples 6-9 and Comparative Example 2

Preparation of YAG Phosphor Material by Adding Silicon Precursor in Raw Powders and then Solid State Reaction Method A mixture of alumina, yttria and cerium nitrate hydrate in a certain stoichiometric ratio and $SiO_2$ were mixed in an appropriate amount of alcohol with weight ratios shown in below Table 2.

Next, a wet ball milling process was carried out for 20 hours with alumina balls of 2 mm in a ball/powder weight ratio of 9 g/7.5 g to get mixed powders. The mixed powers were dried for 6 hours in an oven at 90° C. and then fired at 1500° C. for 12 hours with a heating rate of 5° C./min, followed by natural cooling to room temperature to get a YAG phosphor material.

TABLE 2

|  | Comparative Example 2 | Example 6 | Example 7 | Example 8 | Example 9 |
|---|---|---|---|---|---|
| YAG:Ce (g) | 7.5000 | 7.4625 | 7.4250 | 7.1250 | 6.7500 |
| $SiO_2$ (g) | 0.0000 | 0.0375 | 0.0750 | 0.3750 | 0.7500 |
| Si doping ratio (wt %) | 0 | 0.5 | 1 | 5 | 10 |

Examples 10-13 and Comparative Example 3

Preparation of YAG Phosphor Ceramic by Adding Silicon Precursor in Raw Powders and then Solid State Reaction Method A mixture of alumina, yttria and cerium nitrate hydrate in a certain stoichiometric ratio and $SiO_2$ were mixed in an appropriate amount of alcohol with weight ratios shown in below Table 3.

Next, a wet ball milling process was carried out for 20 hours with alumina balls of 2 mm in a ball/powder weight ratio of 9 g/7.5 g to get mixed powders. The mixed powers were dried for 6 hours in an oven at 90° C. and then fired at 1500° C. for 12 hours with a heating rate of 5° C./min, followed by natural cooling to room temperature to get a YAG phosphor precursor of $Y_{2.99}Ce_{0.01}Al_5O_{12}$.

The above phosphor precursor was pressed into a green body with a diameter of 2.56 cm by uniaxial pressing under a pressure of 25-35 kg/cm² for 10 minutes. The resulting green body was heated to 1500° C. at a heating rate of 5° C./min and fired for 24 hours, followed by natural cooling to room temperature to get a YAG phosphor ceramic plate.

TABLE 1

|  | Comparative Example 1 | Example 1 | Example 2 | Example 3 | Example 4 | Example 5 |
|---|---|---|---|---|---|---|
| Precursor (g) | 2.500 | 2.4875 | 2.4750 | 2.4375 | 2.3750 | 2.2500 |
| $SiO_2$ (g) | 0.000 | 0.0125 | 0.0250 | 0.0625 | 0.1250 | 0.2500 |
| Si doping ratio (wt %) | 0 | 0.5 | 1 | 2.5 | 5 | 10 |

TABLE 3

|  | Comparative Example 3 | Example 10 | Example 11 | Example 12 | Example 13 |
|---|---|---|---|---|---|
| YAG:Ce (g) | 7.5000 | 7.4625 | 7.4250 | 7.1250 | 6.7500 |
| SiO$_2$ (g) | 0.0000 | 0.0375 | 0.0750 | 0.3750 | 0.7500 |
| Si doping ratio (wt %) | 0 | 0.5 | 1 | 5 | 10 |

Examples 14-17

Preparation of YAG Phosphor Ceramic by Forming YAG Phase-Containing Phosphor Precursor Through Solid State Reaction Method and Then Adding Silicon Precursor)

Alumina, yttria and cerium nitrate hydrate were mixed in an appropriate amount of alcohol with a certain stoichiometric ratio.

Next, a wet ball milling process was carried out for 20 hours with alumina balls of 2 mm in a ball/powder weight ratio of 9 g/7.5 g to get mixed powders. The mixed powers were dried for 6 hours in an oven at 90° C. and then fired at 1500° C. for 12 hours with a heating rate of 5° C./min, followed by natural cooling to room temperature to get a YAG phase-containing phosphor precursor of $Y_{2.99}Ce_{0.01}Al_5O_{12}$.

According to the weight ratios shown below in Table 4, SiO$_2$ powder as a silicon precursor was added in and blended with the YAG phase-containing phosphor precursor in a mortar for 0.5 hour. Then, the mixed powders of SiO$_2$ and the phosphor precursor were pressed into a green body with a diameter of 2.56 cm by uniaxial pressing under a pressure of 25-35 kg/cm$^2$ for 10 minutes. The resulting green body was heated to 1500° C. at a heating rate of 5° C./min and fired for 24 hours, followed by natural cooling to room temperature to get a YAG phosphor ceramic plate.

TABLE 4

|  | Example 14 | Example 15 | Example 16 | Example 17 |
|---|---|---|---|---|
| YAG:Ce (g) | 7.4625 | 7.4250 | 7.1250 | 6.7500 |
| SiO$_2$ (g) | 0.0375 | 0.0750 | 0.3750 | 0.7500 |
| Si doping ratio (wt %) | 0.5 | 1 | 5 | 10 |

Example 18

Preparation of YAG Phosphor Ceramic by Adding Silicon Precursor in Raw Powders, Forming YAG Phase-Containing Phosphor Precursor Through Solid State Reaction Method, and then Adding Silicon Precursor A mixture of alumina, yttria and cerium nitrate hydrate in a certain stoichiometric ratio and 5 wt % of SiO$_2$ were mixed in an appropriate amount of alcohol.

Next, a wet ball milling process was carried out for 20 hours with alumina balls of 2 mm in a ball/powder weight ratio of 9 g/7.5 g to get mixed powders. The mixed powers were dried for 6 hours in an oven at 90° C. and then fired at 1500° C. for 12 hours with a heating rate of 5° C./min, followed by natural cooling to room temperature to get a YAG phase-containing phosphor precursor of $Y_{2.99}Ce_{0.01}Al_5O_{12}$. Subsequently, 1 wt % of SiO$_2$ powder was added in and blended with the YAG phase-containing phosphor precursor in a mortar for 0.5 hour. Then, the mixed powders of SiO$_2$ and the phosphor precursor were pressed into a green body with a diameter of 2.56 cm by uniaxial pressing under a pressure of 25-35 kg/cm$^2$ for 10 minutes. The resulting green body was heated to 1500° C. at a heating rate of 5° C./min and fired for 24 hours, followed by natural cooling to room temperature to get a YAG phosphor ceramic plate.

Examples 19-22

Preparation of YAG Phosphor Ceramic by Forming YAG Phase-Containing Phosphor Precursor Through Chemical Co-Precipitation Method and then Adding Silicon Precursor First, aluminum nitrate hydrate, yttrium nitrate hydrate and cerium nitrate hydrate were mixed in a certain stoichiometric ratio and completely dissolved in 125 mL of distilled water.

Next, 42.5 mL of triethylamine were gradually titrated therein with stirring for several minutes to generate white gel, followed by suction filtering to get the white gel. Subsequently, the gel was dried for 20 hours in an oven at 90° C. to remove moisture and then pre-sintered for 3 hours at 500° C. (heating rate: 5° C./min) to burn organic components, followed by cooling to room temperature (cooling rate: 5° C./min) to get a desired precursor. The resulting precursor was heated to 1400° C. at a heating rate of 5° C./min and fired for 8 hours, followed by natural cooling to room temperature to get a YAG phase-containing phosphor precursor ($Y_{2.99}Ce_{0.01}Al_5O_{12}$).

According to the weight ratios shown in below Table 5, SiO$_2$ powder as a silicon precursor was added in the precursor, followed by a ball milling process for 5 hours using alumina balls with a diameter of 5 mm in a ball/powder weight ratio of 3 g/2.5 g to get finer powder.

The above powder was pressed into a green body with a diameter of 2.56 cm by uniaxial pressing or cold isostatic pressing under a pressure of 60 kg/cm$^2$ for 1 minute. The resulting green body was heated to 1400° C. at a heating rate of 5° C./min and fired for 8 hours, followed by natural cooling to room temperature to get a YAG phosphor ceramic plate.

TABLE 5

|  | Example 19 | Example 20 | Example 21 | Example 22 |
|---|---|---|---|---|
| YAG:Ce (g) | 2.4875 | 2.4750 | 2.3750 | 2.2500 |
| SiO$_2$ (g) | 0.0125 | 0.0250 | 0.1250 | 0.2500 |
| Si doping ratio (wt %) | 0.5 | 1 | 5 | 10 |

Measurement of PL Intensity and Quantum Efficiency

The photoluminescence (PL) intensity of the YAG:Ce phosphor ceramic plates were measured using a fluorescence spectrophotometer (Hitachi/F-7000). For quantum efficiency measurements, the fluorescence spectrophotometer (Hitachi/F-7000) with an integrating sphere was used to collect and compare the PL spectra of YAG:Ce ceramic plates and a standard aluminum oxide white sheet under the same excitation wavelength. The difference of the integrated absorption area between the standard and the sample means the photo-absorption energy, and the difference of the integrated emission area between the standard and the sample means the photo-emission energy. Therefore, the quantum efficiency can be obtained by calculating the ratio of the two areas. The quantum yields of the YAG ceramics prepared by the above examples and comparative examples are shown in below Tables 6, 7 and 8.

of the YAG phosphor material. Moreover, the YAG ceramic plate prepared by forming YAG phase-containing phosphor precursor powder and then adding silicon precursor (i.e. Example 16) showed excellent quantum efficiency. Also, the YAG ceramic plate prepared by adding silicon precursor, forming YAG phase-containing phosphor precursor powder and then adding silicon precursor (i.e. Example 18) exhibited excellent quantum efficiency.

TABLE 6

|  | Comparative Example 1 | Example 1 | Example 2 | Example 3 | Example 4 | Example 5 |
|---|---|---|---|---|---|---|
| Si doping ratio (wt %) | 0 | 0.5 | 1 | 2.5 | 5 | 10 |
| Quantum yield (%) | 32.2 | 33.8 | 40.4 | 35.8 | 43.2 | 38.7 |
| Increasing amount of quantum yield | — | 4.86% | 25.4% | 11.1% | 33.9% | 20.1% |

TABLE 7

|  | Si doping ratio (wt %) | Quantum yield (%) | Normalized PL intensity |
|---|---|---|---|
| Comparative Example 3 | 0 | 40.7 | 1.00 |
| Example 10 | 0.5 | 40.8 | 1.08 |
| Example 11 | 1 | 45.6 | 1.00 |
| Example 12 | 5 | 50.1 | 1.17 |

TABLE 7-continued

|  | Si doping ratio (wt %) | Quantum yield (%) | Normalized PL intensity |
|---|---|---|---|
| Example 14 | 0.5 | 42.9 | 0.92 |
| Example 15 | 1 | 46.4 | 1.03 |
| Example 16 | 5 | 54.0 | 1.34 |
| Example 1 | 0.5 | 33.8 | 0.74 |
| Example 2 | 1 | 40.4 | 0.88 |
| Example 4 | 5 | 43.2 | 0.89 |

TABLE 8

|  | Comparative Example 1 | Example 12 | Example 16 | Example 18 |
|---|---|---|---|---|
| Si doping ratio (wt %) | 0 | 5 | 5 | 5+1 |
| Quantum yield (%) | 40.7 | 50.1 | 54.0 | 57.4 |
| Normalized PL intensity (a.u.) | 1.00 | 1.13 | 1.30 | 1.38 |

It can be seen in Tables 6, 7 and 8 that the PL intensity of the YAG ceramics can be enhanced by a small amount of Si dopant, resulting in the increase of quantum efficiency. Specially, the optimum quantum efficiency can be achieved with the presence of Si dopant in 5 wt % based on the total weight of the YAG phosphor material. Moreover, the YAG ceramic plate prepared by forming YAG phase-containing phosphor precursor powder and then adding silicon precursor (i.e. Example 16) showed excellent quantum efficiency. Also, the YAG ceramic plate prepared by adding silicon precursor, forming YAG phase-containing phosphor precursor powder and then adding silicon precursor (i.e. Example 18) exhibited excellent quantum efficiency.

Measurement of Specific Weight/Thermal Diffusivity/Thermal Conductivity

Thermal diffusivity and thermal conductivity of the YAG phosphor ceramics were measured using a laser flash apparatus (NETZSCH/LFA 447 Nanoflash). Moreover, the density of the YAG phosphor ceramics was measured using a specific gravity balance (MatsuHaku/MH-1245). The results were shown in below Table 9.

TABLE 9

|  | Si doping ratio (wt %) | Density (g/cm$^3$) | Thickness (mm) | Diameter (mm) | Thermal Diffusivity (mm$^2$/s) | Thermal Conductivity (W/m · K) |
|---|---|---|---|---|---|---|
| Comparative Example 1 | 0 | 1.930 | 2.450 | 12.550 | 0.847 | 0.799 |
| Example 4 | 5 | 3.520 | 2.400 | 13.000 | 2.288 | 4.484 |

As shown in Table 9, the density of the YAG phosphor ceramics can be enhanced by silicon addition in a small amount, indicating that silicon dopant can induce densification enhancement of YAG phosphor ceramics. Besides, silicon doping also caused the increase of thermal diffusivity, and thermal conductivity of YAG ceramics with silicon addition was six times larger than that without silicon addition, indicating that thermal conductivity of YAG ceramics can be enhanced by silicon doping.

Measurement of Shrinkage

The shrinkage was calculated according to the following equation (II):

$$\text{Shrinkage}(\%) = [(V1 - V2)/V1] \times 100\% \quad \text{(II)}$$

where, V1 is the volume of the phosphor ceramic plate before sintering, and V2 is the volume of the phosphor ceramic plate after sintering. The results were shown in below Table 10.

TABLE 10

|  | Comparative Example 3 | Example 12 | Example 16 |
|---|---|---|---|
| Shrinkage (%) | 2.56 | 23.84 | 47.58 |
| Density (g/cm$^3$) | 2.37 | 3.38 | 4.20 |

As shown in Table 9, the YAG ceramic plate with a small amount of silicon can exhibit a larger shrinkage, indicating that increased densification can induce easier migration of $Ce^{3+}$ ions and the enhancement of PL intensity.

Through the above experiments, it can be recognized that Si-doped ceramics with increased thermal conductivity, densification and PL intensity can be obtained by doping of a small amount of silicon precursor, whether chemical co-precipitation method or solid state method was applied.

Example 23

LED Device

Figure 2:
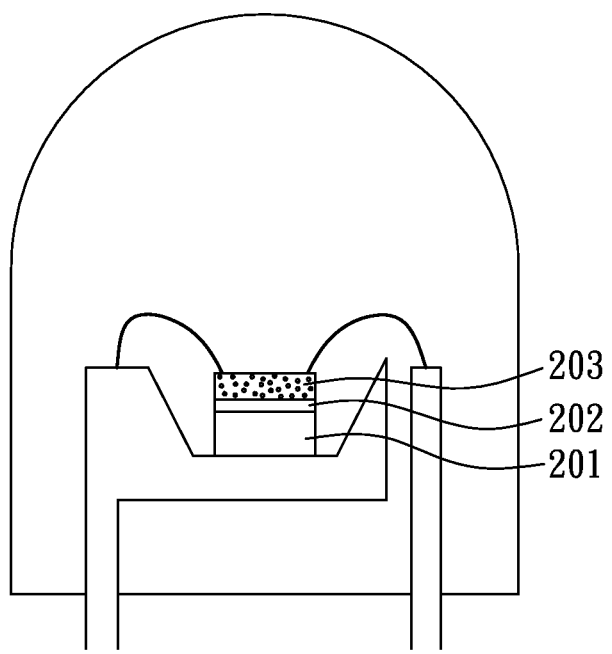
FIG. 2 shows a schematic view of a conventional LED device according to Example 23 of the present invention.

The YAG ceramic plate prepared in Example 4 was applied in the LED device of the present example. As shown in FIG. 2, the LED device of the present example included: an LED chip 201; and a YAG ceramic plate 203 disposed on a light output surface of the LED chip 201 through an adhesive 202. In this example, the LED chip 201 was a blue LED chip that can emit light of 458 nm, and the YAG ceramic plate having a thickness of 0.25 mm was used.

Comparative Example 4

LED Device

The LED device of this comparative example was the same as illustrated in Example 23, except that this comparative example used the YAG ceramic prepared in Comparative Example 1.
Studies on Optical Properties of LED device with YAG Ceramic Plate A spectrophotometer (Ocean Optics/USB2000) was used to examine the LED devices of Example 23 and Comparative Examples 4. The results are shown in Table 11 below.

TABLE 11

| | Comparative Example 4 | | | | Example 23 | | | |
|---|---|---|---|---|---|---|---|---|
| | Thickness (mm) | | | | | | | |
| | 0.25 | | | | 0.25 | | | |
| | Drive Current (mA) | | | | | | | |
| | 10 | 20 | 30 | 40 | 10 | 20 | 30 | 40 |
| x | 0.339 | 0.340 | 0.340 | 0.338 | 0.343 | 0.342 | 0.343 | 0.343 |
| y | 0.382 | 0.376 | 0.370 | 0.366 | 0.433 | 0.431 | 0.430 | 0.429 |
| $W_{ex}$ (nm) | 458 | 458 | 458 | 458 | 458 | 458 | 458 | 458 |
| $W_{em}$ (nm) | 543 | 543 | 543 | 543 | 543 | 543 | 543 | 543 |
| lm | 0.00014 | 0.00029 | 0.00043 | 0.00058 | 0.00102 | 0.00207 | 0.00313 | 0.00417 |
| lux | 1126.8 | 2320.8 | 3479.7 | 4666.5 | 8131.4 | 16496 | 24927 | 33214 |
| $V_f$ (V) | 2.587 | 2.632 | 2.666 | 2.695 | 2.587 | 2.632 | 2.666 | 2.695 |
| W | 0.02587 | 0.05264 | 0.07998 | 0.1078 | 0.02587 | 0.05264 | 0.07998 | 0.1078 |
| lm/W | 0.00541 | 0.00550 | 0.00546 | 0.00538 | 0.03942 | 0.03932 | 0.03913 | 0.03868 |

In Table 11, the thickness means the thickness of the YAG ceramic plate; the drive current means a current driving the LED chip; x and y are CIE coordinates; $W_{ex}$ represents the dominant excitation wavelength of the YAG ceramic plate (i.e. emission wavelength of the LED chip); $W_{em}$ represents the dominant emission wavelength of the YAG ceramic plate; lm is a unit of luminous flux, lumen; lux is a unit of illuminance; $V_f$ means the voltage required to power the LED; and W is the light power that is equal to the product of $V_f$ and the drive current. The efficiency (lm/W) of the sample can be calculated by the light power (W) and the lumen value (lm).

As shown in Table 11, the lumen and illuminance increased and the total lumen efficiency was maintained nearly constant while current was increased. Moreover, in the condition of the same ceramic thickness, power and drive current, the lumen and illuminance of the LED device with Si-doped YAG ceramic plate applied therein (i.e. Example 23) were six times larger than that of the LED device with non-doped YAG ceramic plate applied therein (i.e. Comparative Example 4), indicating that Si-doped YAG ceramic plate can provide better lumen efficiency compared to nondoped YAG ceramic plate.

In conclusion, the Si-doped YAG ceramic plate of the present invention can enhance the performance of an LED device and is suitable for the development of white LED device.

What is claimed is:

1. A method of manufacturing an yttrium aluminum garnet phosphor material, comprising:
    (A) providing a precursor powder that includes yttrium, aluminum and a metal, where the metal is at least one selected from the group consisting of Ce, Dy, Gd, Eu, Tb, La, Pr, Nd and Sm;
    (B) pre-sintering the precursor powder to obtain a phosphor precursor;
    (C) adding a silicon precursor in the phosphor precursor; and
    (D) sintering a mixture of the silicon precursor and the phosphor precursor to obtain the yttrium aluminum garnet phosphor material.

2. The method of claim 1, wherein the phosphor precursor is prepared by a process including chemical co-precipitation method, solid state reaction method, sol-gel method, spray pyrolysis method, combustion method, hydrothermal synthesis, sintering method or microwave-assisted combustion method.

3. The method of claim 2, wherein the step (A) is performed by providing and mixing an aluminum precursor, an yttrium precursor and a metal precursor to form the precursor powder.

4. The method of claim 3, wherein the aluminum precursor is aluminum nitrate or aluminum oxide, the yttrium precursor is yttrium nitrate or yttrium oxide, and the metal precursor is a metal nitrate or a metal oxide therewith the metal being at least one selected from the group consisting of Ce, Dy, Gd, Eu, Tb, La, Pr, Nd and Sm.

5. The method of claim 3, wherein the metal is at least one selected from the group consisting of Ce, Tb and Eu.

6. The method of claim 5, wherein the metal is Ce.

7. The method of claim 4, further comprising a step (A1) after the step (A): adding a silicon precursor.

8. The method of claim 5, further comprising a step (C1) after the step (C): pressing the mixture of the silicon precursor and the phosphor precursor.

9. The method of claim 8, wherein the yttrium aluminum garnet phosphor material is an yttrium aluminum garnet phosphor ceramic plate.

10. The method of claim 6, wherein the silicon precursor is an organic silicon, an inorganic silicon or a mixture thereof.

11. The method of claim 9, wherein the silicon precursor is silica ($SiO_2$), tetramethyl orthosilicate ($C_4H_{12}O_4Si$), tetraethyl orthosilicate ($C_8H_{20}O_4Si$), tetrapropyl orthosilicate ($C_{12}H_{28}O_4Si$), tetraisopropyl orthosilicate ($C_{12}H_{28}O_4Si$), tetrabutyl orthosilicate ($C_{16}H_{36}O_4Si$), tetra-o-cresol orthosilicate ($C_{28}H_{28}O_4Si$), tetra(2-Ethyl Butyl)silicate ($C_{24}H_{52}O_4Si$), silicon tetrachloride ($SiCl_4$), metasilicate ($H_2SiO_3$), disilicate ($H_2Si_2O_5$), silicic acid ($H_4SiO_4$), silanol ($H_4OSi$), tetramethylsilane ($C_4H_{12}Si$), hexamethyldisiloxane ($C_6H_{18}OSi_2$) or a mixture thereof.

12. The method of claim 10, wherein the silicon precursor is silica.

13. The method of claim 1, wherein the silicon precursor in the step (C) is added in an amount of 0.1-10 wt % based on the total weight of the yttrium aluminum garnet phosphor material.

\* \* \* \* \*